United States Patent
McCauley

(10) Patent No.: US 9,589,075 B2
(45) Date of Patent: Mar. 7, 2017

(54) CONDUIT DRAWING TOOL

(75) Inventor: John McCauley, Germantown, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 1119 days.

(21) Appl. No.: 13/546,899

(22) Filed: Jul. 11, 2012

(65) Prior Publication Data

US 2014/0019095 A1    Jan. 16, 2014

(51) Int. Cl.
 *G06F 17/50* (2006.01)

(52) U.S. Cl.
 CPC .................................. *G06F 17/50* (2013.01)

(58) Field of Classification Search
 None
 See application file for complete search history.

(56) References Cited

U.S. PATENT DOCUMENTS

| | | | | |
|---|---|---|---|---|
| 5,412,770 | A * | 5/1995 | Yamashita et al. | 345/442 |
| 2001/0047251 | A1* | 11/2001 | Kemp | 703/1 |
| 2004/0021679 | A1* | 2/2004 | Chapman | G05B 15/02 715/700 |
| 2005/0248562 | A1* | 11/2005 | Maystrovsky et al. | 345/419 |
| 2008/0259958 | A1* | 10/2008 | Woo | 370/473 |

OTHER PUBLICATIONS

Autodesk, AutoCAD MEP 2010 Users Guide, Mar. 2009, 878 pages.*
"GENESIS32", http://www.iconics.com/Home/Products/HMI-SCADA-Software-Solutions/GENESIS32.aspx, (accessed Jul. 11, 2012).
"GraphWorX32", http://www.iconics.com/Home/Products/HMI-SCADA-Software-Solutions/GENESIS32/GraphWorX32.aspx#, (accessed Jul. 11, 2012).
"Advanced HMI SCADA Software for Water and Wastewater", http://www.youtube.com/v/buTBsdlROSk&hl=en_US&feature=player_embedded&version=3, (accessed Jul. 11, 2012).
"HMI/SCADA Solutions for the Water and Wastewater Industry (Iconics)", Webinar, Nov. 23, 2010.

* cited by examiner

Primary Examiner — Omar Fernandez Rivas
(74) Attorney, Agent, or Firm — Fletcher Yoder P.C.

(57) ABSTRACT

Embodiments of the present disclosure include displaying a computer-simulated design environment on a user viewable screen of an automation control system, providing a tool within the computer-simulated design environment, wherein the tool is configured to modify the computer-simulated design environment, and generating a visual representation of a first conduit segment extending between a first anchor point and a second anchor point on the user viewable screen, wherein the first anchor point and second anchor point are generated based on sequential activations of the tool.

17 Claims, 5 Drawing Sheets

CONDUIT DRAWING TOOL

BACKGROUND

The present invention relates generally to the field of interface devices and to their configuration and programming. More particularly, the present invention relates to techniques for manipulation of objects of industrial automation devices and their visual representations on the interface devices.

A wide range of interface devices are known and are presently in use in many different fields. In industrial automation, for example, human machine interfaces or "HMIs" are commonly employed for monitoring or controlling various processes. The HMIs may read from or write to specific registers such that they can reflect the operating state of various machines, sensors, processes, and so forth. The interfaces can also write to registers and memories such that they can, to some extent, control the functions of the process. In monitoring functions alone, little or no actual control is executed. In many other settings similar devices are employed, such as in automobiles, aircraft, commercial settings, and a host of other applications. In many applications, the interface may not communicate with a remote device or process, but may be operated in a stand-alone manner.

In these interface devices, various objects used in the interface may correlate to different controls, monitors, or any other parameter of an industrial automation device. Some of these objects may have visual representations on the interface devices, while other objects may not be visually represented but may be accessible for configuration and programming by a user. A user may desire to manipulate these objects, such as by creating new objects, copying objects, pasting objects, etc., to create and customize an interface.

BRIEF DESCRIPTION

In one embodiment, a method includes displaying a computer-simulated design environment on a user viewable screen of an automation control system, providing a tool within the computer-simulated design environment, wherein the tool is configured to modify the computer-simulated design environment, and generating a visual representation of a first conduit segment extending between a first anchor point and a second anchor point on the user viewable screen, wherein the first anchor point and second anchor point are generated based on sequential activations of the tool.

In a second embodiment, an interface system includes a tangible, computer-readable medium and programming code stored on the tangible, computer-readable medium. The programming code includes instructions for displaying a computer-simulated design environment on a user viewable screen of the interface system, providing a tool within the computer-simulated design environment, wherein the tool is configured to modify the computer-simulated design environment, and generating a visual representation of a first conduit segment extending between a first anchor point and a second anchor point on the user viewable screen, wherein the first anchor point and second anchor point are generated based on sequential activations of the tool.

In another embodiment, an automation controller includes a processor configured to implement, for display on a user-viewable screen, a design environment or a run-time environment based on the design environment, wherein the design environment comprises a tool configured to modify graphical features within design environment by generating a visual representation of a first conduit segment extending between a first anchor point and a second anchor point on the user viewable screen, wherein the first anchor point and second anchor point are generated based on sequential activations of the tool.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
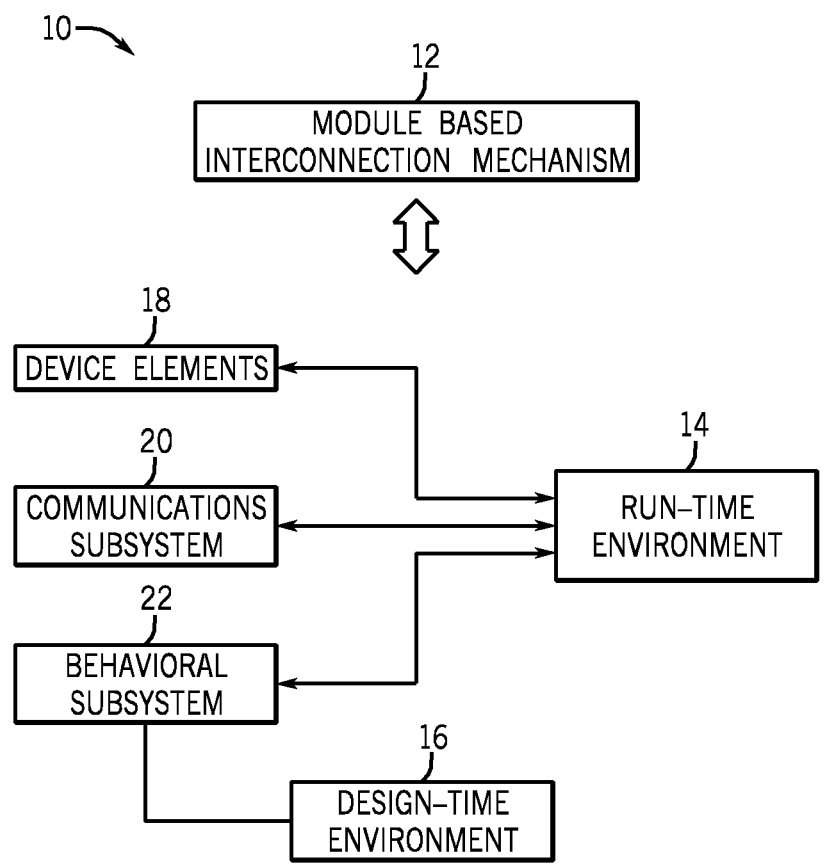
FIG. 1 is a general overview of a framework for an interface configuration system, in accordance with certain aspects of the present invention.

FIG. 1 is a diagrammatical representation of a control and monitoring software framework 10 for an interface, in accordance with an embodiment of the present invention. The framework 10 facilitates building functional software by utilizing a module based interconnection mechanism 12, which inherently supports dynamic manipulation and configuration. This dynamic manipulation and configuration ability facilitates efficient provision of feature-rich configuration environments for configurable interfaces. That is, as described below, individual device elements are provided as stand-alone code that can be individually programmed, pre-written for use, as in a library, customized in their function and appearance in screens, and interconnected to provide information to a user as well as monitoring and control functions.

The framework 10 includes two interrelated software environments that can reside on a single system (e.g., computer). Specifically, a run-time environment 14 enables an operator (e.g., a human user) to interact with an application, such as a process during run-time (e.g., during use of the interface, typically during interaction with or observance of a process in operation). A design-time environment 16 permits a designer to generate and configure the interface and its components. For example, a system may graphically present run-time information to an operator via the run-time environment 14 on a display (e.g., computer or interface device screen). Further, the system may include means (e.g., a keypad or computer mouse) for accepting operator input that can be detected and managed via the run-time environment 14. The environments interact in innovative ways to provide greatly enhanced programming and use of the interface.

The run-time environment 14 includes or provides access to device elements 18. The device elements 18 are software components that may include any accessible or configurable element in a software environment. For example, the device elements 18 include software components, such as "ActiveX" controls, "Qt" controls, or ".NET" components that are managed by the run-time environment 14. "ActiveX", "Qt", and ".NET" refer to object-oriented concepts, technologies and tools. Those skilled in the art will be well-acquainted with such programming approaches generally. In the present context, such standards should be taken as merely examples, and "device elements" should be understood as including any generally similar components or self-sufficient programs that can be run as quasi-independent elements, sometimes referred to as "objects". Other standards and platforms exist for such elements, typically championed by different companies or industry groups.

Because such device elements 18 are basic to certain of the inventive concepts, a few words of introduction are in order. Device elements 18 generally include four features: properties, methods, connections (or connection points) and communications interfaces. Properties are attributes that can be adjusted, such as to define an image or representation of the element in a screen view, as well as its location on the screen, and so forth. A method is an executable function (sometimes referred to herein as the elements "functionality" or "state engine"), and defines an operation performed by execution of the element. A connection is a link between elements, and can be used to cause data (read from a memory or written to a memory) to be sent to another element.

Specific examples of device elements 18 may include software pushbuttons, timers, gauges, PLC communication servers, screens, and applications. In general, virtually any identifiable function may be configured as such an element. Moreover, such elements may communicate with one another to perform a wide range of display, monitoring operations and control functions. It should be noted that device elements 18 do not require special limitations for supporting a design mode. Also, while elements associated with an image are quite useful, particularly for screen views, many elements may not have a visual representation, but may perform functions within an HMI, such as calculations, or even management and data exchange between other elements.

The run-time environment 14 typically operates using a communications subsystem 20. The communications subsystem 20 is adapted to interconnect the device elements 18. In practice, the communications subsystem 20 may be thought of as including the connections of the device elements 18. However, it may include a range of software, hardware and firmware that send data to and receive data from external circuits, such as PLC's, other computers, networks, satellites, sensors, actuators, and so forth.

The run-time environment 14 typically operates using a behavioral subsystem 22, which is adapted to manage the behavior of the device elements 18. For example, responsibilities of the behavioral subsystem 22 may include the following: place and move device elements, modify device elements, group device elements 18 on interchangeable screens, save and restore screen layouts, manage security, save and restore connection lists, and supply remote access to the run-time environment 14. Here again, in practice, such behaviors may be defined as part of the profile (i.e., the "method" or "state engine") of each device element 18.

The design-time environment 16 includes an advanced implementation of the behavioral subsystem 22 that facilitates direct or indirect manipulation of the run-time environment 14, without impeding or compromising the behavior of the run-time environment 14. That is, design and reconfiguration can be done even while an interface is operating. The behavioral subsystem 22 extends access to the run-time environment 14 via remote provision of the design-time environment 16, such as in a conventional browser. The behavioral subsystem 22 allows a designer to interact with and change aspects of the run-time environment 14 of an HMI via a remote configuration station by serving the design-time environment 16 or aspects thereof to the configuration station from the HMI. For example, an HMI coupled to a laptop via a network may provide a user with configuration capabilities by serving up a specific design-time environment 16 to the laptop via the network.

In current embodiments, the design-time environment 16 may be a product of combining Dynamic Hypertext Markup Language (DHTML) and an Active Server Page (ASP) server scripting to serve dynamic content to a browser. An ASP script is specially written code that includes one or more scripts (i.e., small embedded programs) that are processed on a server (e.g., Web server) before the page is sent to a user. Typically, in conventional usage, such script prompts a server to access data from a database and to make a change in the database. Next, the script typically builds or customizes the page before sending it to the requestor. As discussed below, such scripting is used in the present framework quite differently, such as to build screen views without prior knowledge of either the functionality of device elements, or their interrelationships.

By facilitating changes to device elements 18, the design-time environment 16 allows the designer to make interchangeable design-time models or specialized implementations of the behavioral subsystem 22. A specific example of a design-time implementation of the behavioral subsystem 22 includes a Web-based design-time environment 16, which extends access to the run-time environment 14 on an HMI via a TCP/IP connection between the HMI and a remote device. The design-time environment 16 (e.g., a Web-based design-time environment) facilitates management of the device elements 18 and other components within the run-time environment 14 without compromising run-time performance or security. In one specialized implementation, the behavioral subsystem 22 gives designers the ability to manipulate aspects of the run-time environment 14 using a Web browser that is capable of accessing a related interface or HMI. As noted above, this is achieved by using a combination of dynamic content, scripting, and configuration of the device element 18 properties.

Figure 2:
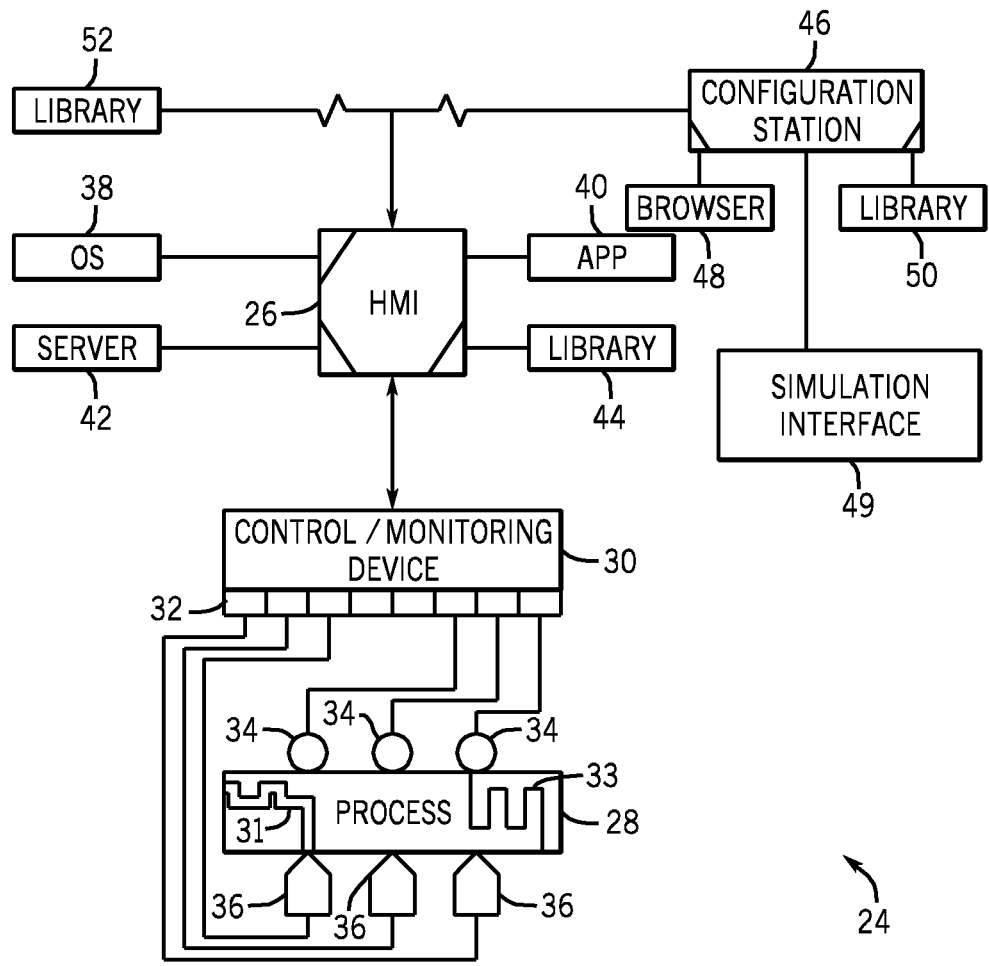
FIG. 2 is a diagrammatical overview of an interface for monitoring or controlling a process, in accordance with an embodiment of the present invention.

FIG. 2 is a diagrammatical representation of a control and monitoring system 24, such as for industrial automation, implementing the framework 10 described above, in accordance with an embodiment of the present invention. The system 24 includes an HMI 26 adapted to interface with networked components and configuration equipment. As illustrated, the HMI 26 is adapted to collaborate with components of a process 28 through a control/monitoring device 30 (e.g., a remote computer, programmable logic controller (PLC) or other controller) having a register 32. For example, the components in the process 28 may include tanks, vessels, motors, engines, or conduits, such as piping 31 or cables 33. The HMI 26 may physically resemble existing hardware, such as a panel, monitor or stand-alone device.

Collaboration between the HMI 26 and components of the process 28 may be facilitated by the use of any suitable network strategies. Indeed, an industry standard network may be employed, such as DeviceNet, to enable data transfer. Such networks permit the exchange of data in accordance with a predefined protocol, and may provide power for operation of networked elements. As noted above, while reference is made in the present discussion to networked systems and to systems incorporating controllers and other equipment, the HMI 26 and programming techniques described may be equally well applied to non-networked components (e.g., GPS displays, game displays, cell phone displays) and to networked systems outside the industrial automation field. For example, the arrangements and processes described below may be used in facilities management, automotive and vehicular interfaces, computer numeric control (CNC) machines, point of sale (POS) systems, control interfaces for commercial markets (e.g., elevators, entry systems), and so forth, to mention only a few.

The run-time or operation environment constructed and managed by a corresponding behavioral subsystem, is stored on and resident in the HMI 26. For example, such a behavioral subsystem can be adapted to load the application configuration framework (e.g., framework 10) from a storage location, such as during initial manufacture or setup of the HMI 26. When loaded, the stored application framework may be adapted to create screens and locate user interface device elements (actually images or pictorial representations corresponding to the elements) in the screens. These applications, screens, and user interface elements are each types of device elements. As described below, the HMI 26 includes a stored application that dictates the layout and interaction of the device elements. The design-time environment 16 (see FIG. 1), which is based on a run-time engine, is also loaded and resident on the HMI 26. The design-time environment 16 may be adapted to handle advanced features (e.g., security management) for both design-time and run-time environments.

The HMI 26 may be adapted to allow a user to interact with virtually any process 28. For example, the process 28 may comprise a compressor station, an oil refinery, a batch operation for making food items, a mechanized assembly line, and so forth. Accordingly, the process 28 may comprise a variety of operational components, such as electric motors, valves, actuators, sensors, conduits, or a myriad of manufacturing, processing, material handling and other applications. As discussed below, certain components of the process 28 may be either static components or dynamics components. Further, the process 28 may comprise control and monitoring equipment for regulating process variables through automation and/or observation. The illustrated process 28 comprises piping 31, cables 33, sensors 34, and actuators 36. The sensors 34 may comprise any number of devices adapted to provide information regarding process conditions. The actuators 36 may similarly include any number of devices adapted to perform a mechanical action in response to an input signal.

As illustrated, these sensors 34 and actuators 36 are in communication with the control/monitoring device 30 (e.g., a PLC) through the register 32 and may be assigned a particular address in the control/monitoring device 30 that is accessible by the HMI 26. The sensors 34 and actuators 36 may be in direct communication with the HMI 26. These devices may be utilized to operate process equipment. Indeed, they may be utilized within process loops that are monitored and controlled by the control/monitoring device 30 and/or the HMI 26. Such a process loop may be activated based on process inputs (e.g., input from a sensor 34) or direct operator input received through the HMI 26.

The server software on the interface permits viewing of the development environment, and direct reconfiguration of the interface (such as the device elements 18 and their associated appearance and functionality) without the need for special viewing or configuration software. This benefit flows from the fact that the device elements and the design-time environment itself is resident in the HMI 26, and "served up" by the HMI 26 to a browser or other general purpose viewer on the configuration station. In other words, necessary support for external computer workstations (e.g., laptop and desktop computers) may be reduced or eliminated. It should be noted that reference to a "browser" for viewing and modifying configuration of the interfaces is not limited to Web browsers or to any particular browser. References to a browser are intended to be exemplary. More generally, the term "browser" is utilized herein to reference software which includes any general purpose viewer.

The HMI 26, through the programming of the device elements (e.g., device elements 18) and/or components of the process 28, may be thought of as including instructions for presenting one or more screen views, and device elements 18 executed upon interaction with the HMI 26 by reference to the screen views (e.g., pressing a button, touching a location of a screen, and the like). The screen views and device elements may be defined by any desired software or software package. For example, the screen views and device elements may be called by or executed by an operating system 38. The device elements, as discussed above, are objects conforming to ".NET", "Qt", or "ActiveX" standards. The operating system itself may be based upon any suitable platform, such as Window CE. As referenced herein, the device elements and tools support Web services or technology for transmitting data over networks (e.g., the Internet). These device elements thus follow a set of rules regarding information sharing and are adapted for use with various scripting and programming languages, as described below. Such device elements enable provision of interactive content to outside applications such as a LAN, WAN, an intranet, an extranet, or even the World Wide Web. Accordingly, the operating system 38 and the various device elements facilitate dynamic configuration of the HMI 26 through a browser by allowing configuration access (e.g., serving up) to the browser.

For example, such configuration access includes access for instantiation of device elements. In other words, new device elements can actually be created and implemented from the browser. Again, it should be noted that the browser does not require actual functional access. Indeed, in one embodiment, requests via the browser result in a "draw" sequence of operations based on data functionality and content of device elements in a container, thus allowing illustration of the device element representations and access to their configuration without actually serving up functional aspects. This allows for configuration via a remote workstation without necessitating technical support for the remote workstation. Such aspects are described in greater detail below.

In addition to the operating system and device elements as described above (and as described in greater detail below), the HMI 26 includes an application or application layer 40. The application 40, which may itself comprise a device element, facilitates access to and acquisition of information from the various device elements of the HMI 26. In particular, the application 40 represents a first level in a multi-level device element that can be enumerated for execution. The application 40 in a practical implementation may comprise a user application in the form of an XML page. The user application is then interacted with by the user or operator, as well as by the designer.

The screen views and device elements may be described as independent executable pieces of software. In a present implementation, the screen views are defined by appropriate code written in a markup language (e.g., Hypertext Markup Language or HTML). Thus, the configuration of graphical interface screens for the HMI 26 may be performed without the use of conversion programs. Further, by programming of the device elements, the screen views may be developed directly on the HMI 26 via resident server software (designated as server 42) that makes the resident development environment available for remote access. Specifically, in one embodiment, representations of certain device elements (e.g., ActiveX or Qt controls) are served up to the browser without serving up the software components themselves. Because a development or design-time environment may be accessed via a browser, the need to download changes to the screens and to update remote configuration software applications can be eliminated.

As noted above, device elements may include functionality by which they read from or write to specific memory or registers of memory, typically in other devices (but which could also be within the HMI 26). For example, a particular function may correspond to writing to or reading from the register 32 of the control/monitoring device 30. In a simple case, for example, an object simply accesses a piece of data (e.g., a state of a component as determined by a sensor), and generates an output signal to write a value corresponding to the state of a different networked device. Much more complex functionality can, of course, be configured. In an industrial control and monitoring context, for example, such device elements may emulate operation of a range of physical components, such as a momentary contact push button, a push button with delayed output, a switch, and so forth. Many pre-programmed device elements may be available for use by the HMI 26. Such functional modules may be accessible via a network, or may be resident on the HMI 26, or resident on a separate device directly linked to the HMI 26. In this way, an HMI 26 supplier or software supplier may provide many possible building blocks from which screens and complex control and monitoring functions may be programmed. Indeed, a library 44 of available device elements may reside on the HMI 26 to facilitate configuration of the HMI 26. The screen instructions may call upon the device elements for performing desired functions based upon operator inputs, and these instructions may be programmed into versions of the pre-programmed elements. For example, the operator may provide initiating inputs by touching a location on a touch screen or depressing keys on a keyboard. Based upon the screen instructions and the device elements associated with the instructions (e.g., with specific locations triggering calls or execution of pre-configured device elements) the desired functions may then be executed. Accordingly, the operator is enabled to interact with a process, typically to change screen views, write to registers, or command the generation of other output or control signals. In a stand-alone implementation, the interactions may simply recall or store data, change screens, and so forth.

One or more separate interface screens may be employed, with some HMIs 26 having many such screens and a great number of device elements. Each device element may, in turn, be uniquely programmed to consider specific inputs, perform specific functions, and generate signals for specific outputs. A plurality of such device elements can be loaded and hosted in a single software "container" (e.g., ActiveX or Qt container) as described below.

The HMI 26 may be configured by interacting directly with a panel or screen on the HMI 26 itself (if one is present), but in many cases configuration will be performed from a remote configuration station 46. For example, access is provided directly to the resident library 44 and/or operating system 38 and application 40 via a browser 48 or similar application. In a present implementation, no other specialized software is required at the configuration station 46. Indeed, the server 42 resident on the HMI 26 may provide access to the device elements in library 44. By storing the device elements in library 44 directly on the HMI 26, the risk of version conflicts and so forth are eliminated or reduced. Additionally, the HMI 26 may be directly connected to the configuration station 46, or accessed by reference to an IP address (Internet Protocol address) assigned to the HMI 26.

As discussed in detail below, the configuration station 46 may include a simulation interface 49, which may display graphics or simulations of device elements, the process 28, and/or process 28 components. For example, the simulation interface 49 may include graphical representations of motors, tanks, vessels, engines, conduits, valves, sensors, actuators, or other components of the process 28. In the illustrated embodiment, the simulation interface 49 may include simulations or graphical representations of the piping 31 and/or the cable 33. The simulation interface 49 may be generated or displayed and/or manipulated using the browser 48 on a computer, monitor, or other display. Additionally, the simulation interface 49 may also be reproduced on the HMI 26. As discussed in detail below, the simulation interface 49 may include various tools which may be used to create, modify, or manipulate the elements or components simulated with the simulation interface 49. For example, the simulation interface 49 may be a component of, cooperate with, or facilitate the design-time environment. In certain embodiments, the simulation interface 49 includes a processor and/or memory to perform one or more of the functions mentioned above.

Access control schemes may be used to limit the ability to change screens and device elements with the configuration station 46 and/or the HMI 26. For example, a password or user access status may be required to gain such access. Further, in a presently contemplated embodiment, the configuration station 46 automatically recognizes the HMI 26 or the terminal on which the HMI 26 is resident as a device upon being coupled to the configuration station (e.g., similar to an external memory or drive). Thus, once connected to the configuration station, the HMI 26 may simply be "recognized" as a device that can be accessed (providing the configuration screen and tools described below).

Once the device elements then resident on the HMI 26 are accessible to the configuration station 46, aspects of the HMI 26 can be modified or updated directly on the HMI 26 via the communication link from the configuration station 46. For example, a user may wish to update a particular HMI 26 graphic to provide graphical features, such as connecting conduit (e.g., piping or cabling), historical data or trending data relating to information being received from a newly installed sensor 34. Additionally, the user may find it desirable or convenient to update the HMI 26 graphic for presentation of such data while in an off-line mode (e.g., without immediately implementing the changes). In such a scenario, the user may link to the library 44 of available device elements via the configuration station 46 and use them to modify the HMI 26 graphic or functionality in a development environment. Specifically, a conduit drawing tool, in accordance with present embodiments, may be employed.

It should be noted that additional device elements can be added to the library 44. For example, if a trending device element is not resident on the HMI 26, a user can download such an element to the HMI 26 from a configuration library 50 resident on the configuration station 46. Alternatively, a user could access the trending device element from a resource library 52 accessible via a network (e.g., the Internet), either directly to HMI 26 or through the configuration station 46. This may be particularly beneficial because new and improved device elements can be downloaded to the HMI 26 individually and on a periodic basis, thus adding new functionality without necessitating the periodic release of new conversion programs or HMI 26 operating systems, or run-time or design-time environment software. The development environment may provide links to such libraries. Further, in embodiments using embedded code (e.g., operating system, server software, device objects, etc.), because the embedded code resides on the HMI 26, version conflicts with the embedded code may be avoided and the necessity for configuration station software upgrades may be eliminated. It should be noted that the libraries 50 and 52 may also be updated with conduit textures and images. For example, actual photographic images of conduit in a process or images of conduit joints may be made available.

Figure 3:
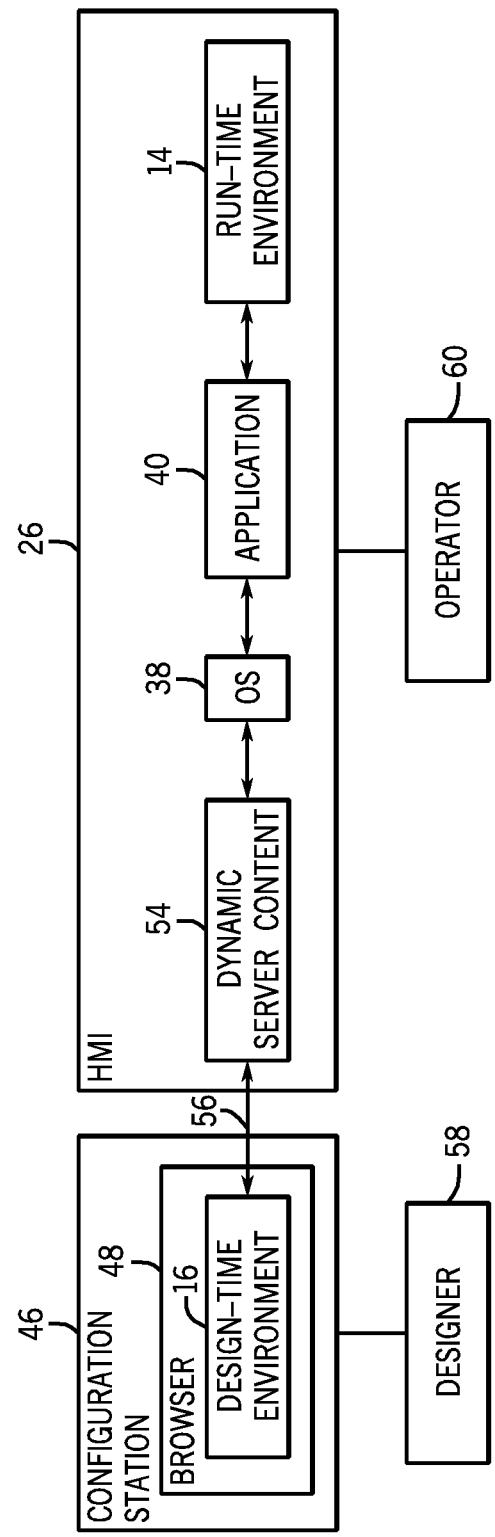
FIG. 3 is an overview of certain of the functional components in an interface and a configuration station, in accordance with an embodiment of the present invention.

FIG. 3 is a high-level flow diagram representing interaction between an embodiment of the HMI 26 and the configuration station 46. In general, a platform for the HMI 26 and configuration station 46 will include the operating system or executive software 38, application software 40, as well as any communication software, a microprocessor, a network interface, input/output hardware, generic software libraries, database management, user interface software, and the like (not specifically represented in FIG. 3). In the illustrated embodiment, a design-time platform and a run-time platform interact within the HMI 26. The design-time platform provides views that are served as the design-time environment 16 (see FIG. 1) to a desktop personal computer platform (e.g., running a suitable operating system, such as Windows XP, Windows Vista, or Linux) and the run-time platform cooperates with the design-time platform via the operating system 38 (e.g., Windows CE, Linux). The design-time platform provides dynamic server content 54, while the run-time platform displays views on the HMI 26 itself (if a display screen is provided on the HMI 26). The design-time environment 16 is displayed in the browser 48 (e.g., Web browser or other general purpose viewer).

FIG. 3 represents at a very high level how the design-time environment 16 interacts with the operating system 38, application 40 and run-time environment 14. The arrow 56 represents dynamic exchange of content between the HMI 26 and configuration station 46. In general, interaction with the design-time environment 16 is the task of a designer 58 who initially configures the HMI 26 screens or views, device elements, their functions and interactions, or who reconfigures such software. The run-time environment 14 is generally interacted with by an operator 60 directly at the HMI 26. It should be noted that while the design-time environment 16 has specific needs, in a current embodiment, it depends heavily on the operating system 38, application 40 and run-time environment 14. The design-time environment 16 and the run-time environment 14 may utilize certain base technologies (e.g., DHTML, HTML, HTTP, dynamic server content, JavaScript, Web browser) to operate respectively in the design-time platform and run-time platform. While, in the illustrated embodiment, the run-time environment 14 and the design-time environment 16 reside on separate platforms, in some embodiments they may reside on the same platform. For example, the design-time platform and run-time platform may be configured as or considered a single platform.

In one embodiment of the present invention, a design-time Web implementation is utilized. This design-time Web implementation offers the speed and flexibility of software running on the design-time platform by using a Web browser (e.g., 48) with DHTML support from the HMI 26, as noted by the dynamic server content 54 in FIG. 3 and as described below. DHTML is used to perform dynamic manipulation of Web content in the design-time environment 16. Further, the dynamic server content 54 is used in the HMI 26 to serve dynamic Web content to the design-time environment 16. This dynamic client-server environment allows the Web browser to simulate an application running on the design-time platform without requiring a piece of software compiled for a related processor.

Figure 4:
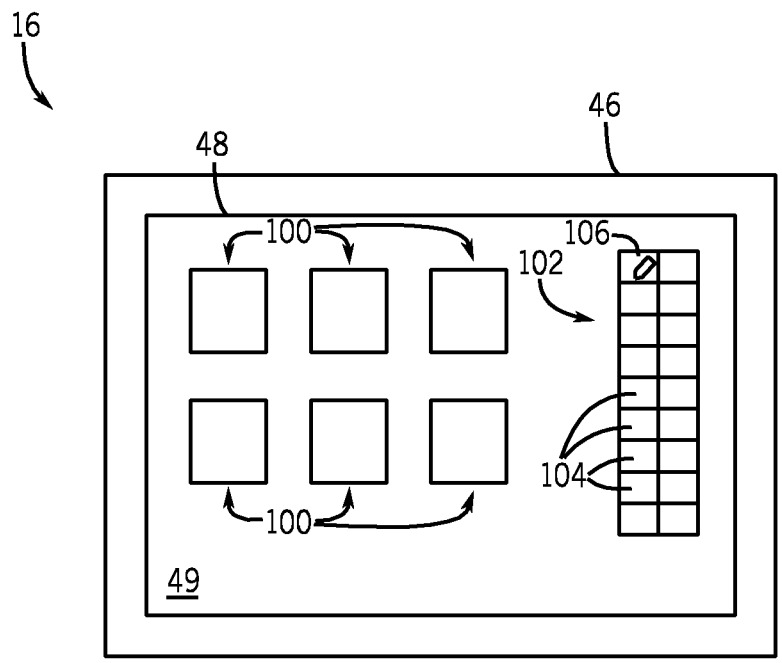
FIG. 4 is a diagram illustrating an embodiment of a configuration station, in accordance with an embodiment of the present invention.

FIG. 4 is a diagram illustrating an embodiment of the configuration station 46. More specifically, the configuration station 46 includes the browser 48 displaying the simulation interface 49, which may function as the design-time environment 16. As mentioned above, the browser 48 may be displayed on a monitor, computer screen, touch screen, or other display. As shown, the simulation interface 49 includes visual representations 100, which may represent various components of the process 28 and/or device elements 18. For example, the visual representations 100 may represent components of the process 28, such as tanks, vessels, valves, conduits (e.g., piping 31 or cables 33), motors, engines, and so forth. Additionally, the visual representations 100 may represent device elements 18, such as sensors 34 or actuators 36. In certain embodiments, the visual representations 100 may be schematics, images, graphics, or other visual representations.

As mentioned above, the configuration station 46 and/or the simulation interface 49 may function as the design-time environment 16. Hence, the visual representations 100 of the components of the process 28 and/or the device elements 18 may be created, generated, modified, and/or manipulated using the simulation interface 49. For example, in the illustrated embodiment, the simulation interface 49 displayed by the browser 48 includes a tool bar 102 of various tools 104. The tools 104 may be used by the designer 58 or the operator 60 to create, generate, modify, or manipulate the visual representations 100. In presently contemplated embodiments, the tool bar 102 includes a Pipe Tool 106 that may be used to create visual representations 100 of conduits, such as piping 31 or cabling 33. However, the Pipe Tool 106 may also be used to create visual representations 100 of other conduits or barrel-shaped elements. In the manner described below, the Pipe Tool 106 may be used to create anchor points within the simulation interface 49, and one or more conduit segments (e.g., visual representations 100) may be generated within the simulation interface 49, extending between the anchor points created with the Pipe Tool 106. Additionally, the simulation interface 49 may be configured to generate joints or other connectors between multiple conduit segments.

Figure 5:
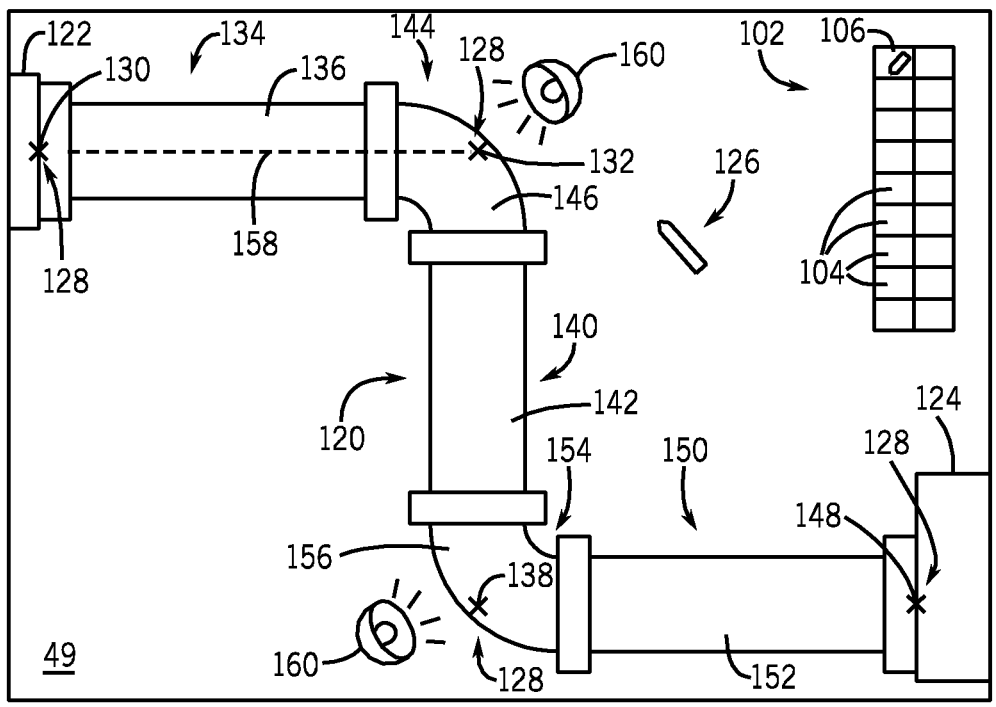
FIG. 5 is a diagram illustrating an embodiment of a simulation interface, in accordance with an embodiment of the present invention.

FIG. 5 is a diagram illustrating an embodiment of the browser 48 displaying the simulation interface 49 (e.g., design-time environment 16). Specifically, the simulation interface 49 shows a visual representation 120 of piping 31. While the illustrated visual representation 120 represents piping 31, in other embodiments the visual representation 120 may represent any other type of conduit. As will be appreciated, piping 31 may be used in a variety of systems and may couple various elements. For example, the piping 31 may be configured to flow a liquid or gas from one system component to another system component. In the illustrated embodiment, the piping 31 extends between and couples a first element 122 and a second element 124. For example, the first and second elements 122 and 124 may be vessels, tanks, or other containers.

In accordance with present embodiments, the visual representation 120 of the piping 31 may be created, in the manner described below, using the Pipe Tool 106. For example, in an embodiment where the browser 48 is displayed on a computer monitor, the Pipe Tool 106 may be selected from the tool bar 102 with a computer mouse or using any other selection method. With the Pipe Tool 106 selected, a Pipe Tool cursor 126 may be used (e.g., controlled with the computer mouse) to create anchor points 128 in the simulation interface 49. For example, the anchor points 128 may be created by positioning the Pipe Tool cursor 126 in a desired anchor point 128 location with the computer mouse and subsequently clicking a computer mouse button. In other embodiments, such as an embodiment where the browser 48 is displayed on a touch screen, the designer 58 or operator 60 may use the touch screen (e.g., with a finger, pen, or stylus) to position the Pipe Tool cursor 126 in a desired anchor point 128 location and subsequently tap the touch screen in the desired anchor point 128 location to create the anchor point 128.

The anchor points 128 created with the Pipe Tool 106 (e.g., the Pipe Tool cursor 126) may be end points of a piping 31 segment. When two anchor points 128 (e.g., end points) are created with the Pipe Tool 106, a visual representation of a piping 31 segment may be generated by the simulation interface 49 (e.g., the design-time environment 16). For example, in the illustrated embodiment, a first anchor point 130 may be created adjacent to the first element 122 to be coupled by the piping 31, and a second anchor point 132 may be created after the first anchor point 130 is created. As the first and second anchor points 130 and 132 are created sequentially, the first and second anchor points 130 and 132 may be recognized (e.g., by the simulation interface 49) as end points of a first piping segment 134, and the simulation interface 49 (e.g., the design-time environment 16) may generate a visual representation 136 of the first piping segment 134. As mentioned above, the visual representation 136 may be a graphic, image, or other visual representation.

Thereafter, a third anchor point 138 may be created using the Pipe Tool 106. That is, the third anchor point 138 may be created after the second anchor point 132 is created. As a result, the second and third anchor points 132 and 138 may be recognized as end points of a second piping segment 140, and the simulation interface 49 (e.g., the design-time environment 16) may generate a visual representation 142 of the second piping segment 140. As shown, the first and second piping segments 134 and 140 are not collinear. In other words, longitudinal axis of the first and second piping segments 134 and 140 are cross-wise to one another. Hence, the simulation interface 49 (e.g., the design-time environment 16) may be configured to create or generate a first joint 144 between the first and second piping segments 134 and 140. That is, a visual representation 146 of the first joint 144 may be created between, thereby coupling, the visual representations of the first and second piping segments 136 and 142. As will be appreciated, the type of first joint 144 created by the simulation interface 49 may depend on the relative orientation between the first and second piping segments 134 and 140. For example, in the illustrated embodiment, a 90 degree joint is created between the first and second piping segments 134 and 140. However, in other embodiments, the relative orientation between the first and second piping segments 134 and 140 may precipitate an elbow joint, T-joint, or other joint being created between the first and second piping segments 134 and 140 by the simulation interface 49. In some embodiments, available joint types may be designated and the conduit images may be automatically manipulated (e.g., by the simulation interface 49 or other component of the design-time environment 16) to accommodate available joints. For example, two piping segments may be realigned from a 45 degree angle to a right angle orientation to accommodate a 90 degree joint.

After the third anchor point 138 is created with the Pipe Tool 106, a fourth anchor point 148 may be created with the Pipe Tool 106. In the illustrated embodiment, the fourth anchor point 148 is created adjacent to the second element 124 to be coupled with the piping 31. As similarly described above, the third and fourth anchor points 138 and 148 may be recognized as end points of a third piping segment 150, and the simulation interface 49 (e.g., the design-time environment 16) may create or generate a visual representation 152 of the third piping segment 150. Additionally, due to the non-collinearity of the second and third piping segments 140 and 150, a second joint 154 may be created by the simulation interface 49 (e.g., the design-time environment 16) to couple the second and third piping segments 140 and 150. That is, a visual representation 156 of the second joint 154 may be created to couple the second and third piping segments 140 and 150 to one another. As with the first joint 144, the configuration of the second joint 154 may depend on the orientation of the second and third piping segments 140 and 150 relative to one another. In this manner, the visual representation 120 of the piping 31 may be created to couple the first and second elements 122 and 124 in the simulation interface 49.

In other embodiments, two anchor points 128 may be created and the simulation interface 49 may be configured to automatically generate a visual representation of piping 31 extending between and coupling certain elements. For example, in the illustrated embodiment, one anchor point 128 may be created at the first element 122 and another anchor point 128 may be created at the second element 124. Thereafter, the simulation interface 49 may generate one or more segments of piping 31, which may include one or more joints, extending from the first and second elements 122 and 124 to create the visual representation 120 of the piping 31. In other words, the simulation interface 49 may be configured to calculate and/or determine the path of the piping 31 (e.g., the piping segments) between the first and second elements 122 and 124. For example, a processor or other component of simulation interface 49 and/or the design-time environment 16 may include one or more algorithms or calculations that may determine an ideal path for the segments of piping 31 between two anchor points 128. In certain embodiments, the algorithm may be configured to account for already existing or established elements in the design-time environment 16 that the piping 31 may be routed around.

While the illustrated embodiment shows linear visual representations of piping segments, the simulation interface 49 may be further configured to generate visual representations of curved or non-linear piping segments. For example, in one embodiment, the visual representation 100 of a piping segment may be bent or curved after a linear visual representation 100 of the piping segment is generated between two anchor points 128. More specifically, the Pipe Tool 106 may be used by positioning the Pipe Tool cursor 126 over the linear visual representation 100 of the piping segment (e.g., over a center line 158 of the first piping segment 134), the Pipe Tool cursor 126 may be activated (e.g., clicked with a computer mouse or tapped on a touch screen), and the Pipe Tool cursor 126 may be dragged to a different location on the simulation interface 49. In this manner, the simulation interface 49 may bend the visual representation 136 of the first piping segment 134, thereby creating a curved piping segment graphic or image. In other embodiments, the tool bar 102 may include a tool (e.g., tool 104) for creating a visual representation 100 of a piping segment that follows a Bezier curve.

As mentioned above, the various visual representations 100 created and displayed with the simulation interface 49 may be images, graphics, schematics, and so forth. In certain embodiments, the style or type of visual representation 100 (e.g., schematic, graphic, image, etc.) may be selected or modified using the tool bar 102. The tool bar 102 may also include other options for modifying styles, colors, materials, sections, shades, and other characteristics of the visual representations 100 of the piping 31 or joints 144. Moreover, additional elements may be created using the simulation interface 49 to modify the appearance of the visual representations 100. For example, in the illustrated embodiment, the simulation interface 49 includes virtual light sources 160. The virtual light sources 160 may be created (e.g., using a tool 104 from the tool bar 102) and positioned at any location in the simulation interface 49. Additionally, the activation, type, color, intensity, direction, and other characteristics of the light produced by the virtual light sources 160 may be modified using the simulation interface 49. When one or more virtual light sources 160 are positioned within the simulation interface 49 (e.g., the design-time environment 16), the simulation interface 49 may generate a resultant shade or fill across the visual representation 100 (e.g., the visual representation 120 of the piping 31). For example, a graduated fill or a radial fill may be generated across the visual representation 120 of the piping 31. In this manner, a realistic or aesthetically pleasing appearance of the visual representation 120 may be created.

Figure 6:
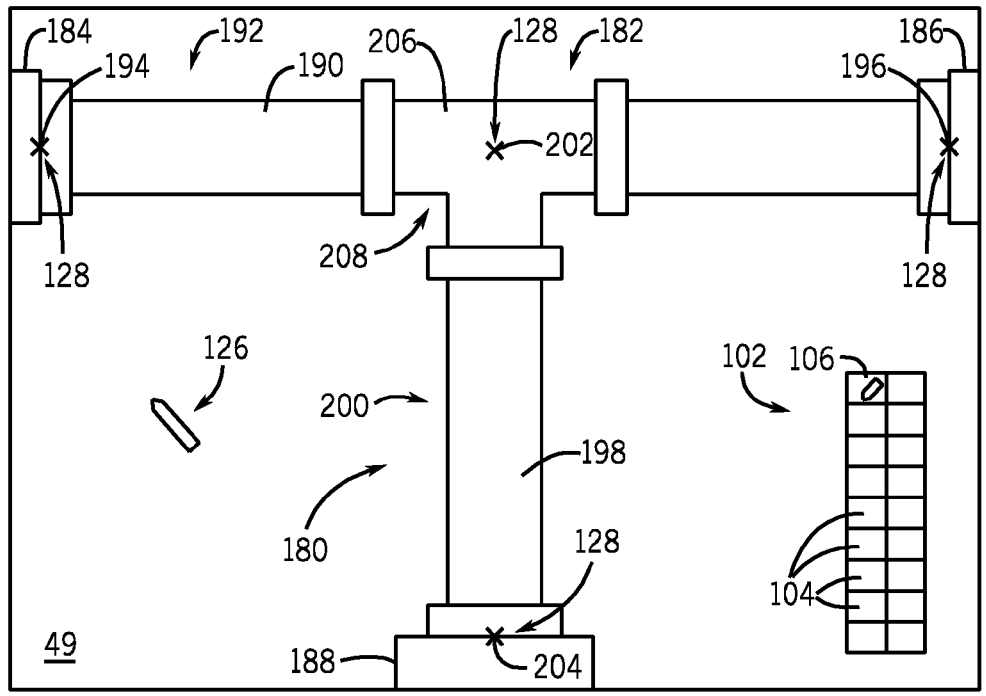
FIG. 6 is a diagram illustrating an embodiment of a simulation interface, in accordance with an embodiment of the present invention.
Figure 7:
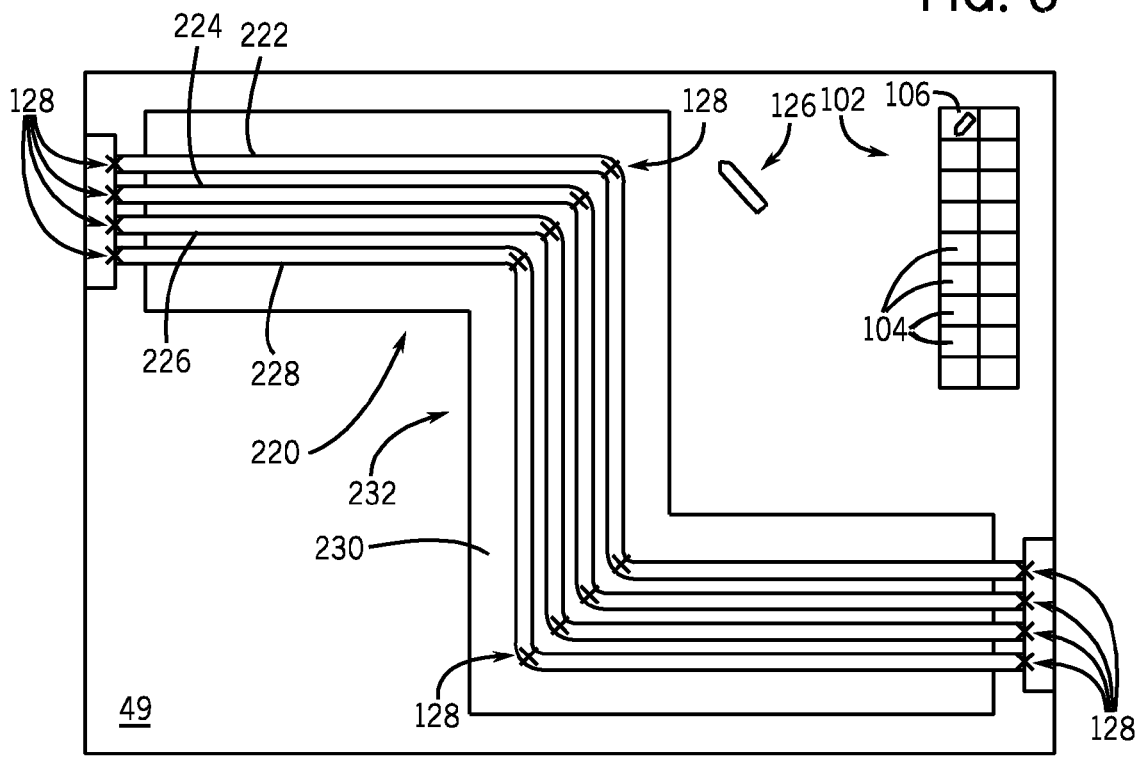
FIG. 7 is a diagram illustrating an embodiment of a simulation interface, in accordance with an embodiment of the present invention.

FIGS. 6 and 7 are diagrams illustrating additional embodiments of the browser 48 displaying the simulation interface 49 (e.g., design-time environment 16) with conduits (e.g., piping 31 or cabling 33) created with the Pipe Tool 106. For example, FIG. 6 illustrates a visual representation 180 of piping 31 including a T-joint 182. More specifically, the visual representation 180 of the piping 31 connects three elements (e.g., a first element 184, a second element 186, and a third element 188). As similarly described above, the visual representation 180 of the piping 31 may be created using the Pipe Tool 106 in the simulation interface 49. For example, a visual representation 190 of a first piping segment 192 may be generated between a first anchor point 194 and a second anchor point 196. That is, the designer 58 or the operator 60 may use the Pipe Tool cursor 126 to create the first and second anchor points 194 and 196 (e.g., by clicking a computer mouse button or tapping a touch screen). In the illustrated embodiment, the first anchor point 194 is created adjacent to the first element 184, and the second anchor point 196 is sequentially created adjacent to the second element 186. The simulation interface 49 recognizes the first and second anchor points 194 and 196 as end points of the first piping segment 192 and creates the visual representation 190 of the first piping segment 192, which couples the first and second elements 184 and 186.

Thereafter, a visual representation 198 of a second piping segment 200 may be created using the simulation interface 49. As shown, the second piping segment 200 may couple the third element 188 to the first piping segment 192, thereby coupling the first, second, and third elements 184, 186, and 188. The second piping segment 200 is created between third and fourth anchor points 202 and 204. The third and fourth anchor points are created using the Pipe Tool 106, in the manner described above. In the illustrated embodiment, the third anchor point 202 is created along the visual representation 190 of the first piping segment 192, and the fourth anchor point 204 is created adjacent to the third element 188. As similarly described above with reference to FIG. 5, the cross-wise axes (e.g., non-collinearity) of the first and second piping segments 192 and 200 may precipitate the generation of a visual representation 206 of a joint 208 between the visual representations of the first and second piping segments 190 and 198. More particularly, due to the location of the third anchor point 202 along the visual representation 190 of the first piping segment 192, the joint 208 generated by the simulation interface 49 may be a T-joint. This may be one of numerous available joint types automatically employed by the simulation interface 49 based on detection of the orientation between conduit segments.

FIG. 7 illustrates a visual representation 220 of cabling 33 created using the Pipe Tool 106 with the simulation interface 49. More specifically, the visual representation 220 includes four strands (e.g., first, second, third, and fourth visual representations 222, 224, 226, and 228) of cabling 33. As will be appreciated, the visual representation 220 of the cabling 33 may be created using the Pipe Tool 106 with the simulation interface 49, in the manner described above. That is, anchor points 128 may be created in the browser 48 using the Pipe Tool 106 (e.g., the Pipe Tool cursor 126) of the simulation interface 49. For example, each of the first, second, third, and fourth visual representations 222, 224, 226, and 228 of strands of cabling 33 may have one or more segments, each segment extending between two or more anchor points 128. In certain embodiments, the various segments (e.g., non-collinear segments) of a visual representation of a strand of cabling may not have joints coupling the segments. Rather, the non-collinear segments may be coupled by bends in the visual representations of cabling 33 created by the simulation interface 49.

As with the embodiments shown in FIG. 5, the illustrated embodiment may include additional elements that may be created using tools 104 from the tool bar 102 or other tools of the simulation interface 49. For example, a visual representation 230 of a cable tray 232 may be created in the simulation interface 49. Additionally, various characteristics of the visual representation 220 of the cabling 33, such as color, style, size, material, and so forth, may be modified or manipulated using tools 104 of the tool bar 102 or other tools of the simulation interface 49. Indeed, an entire visualization may be selected and a style of illustrated conduit may be changed. For example, realistic (e.g., photo-based) imaging may be replaced with schematic imaging, or overhead imaging may be replaced with perspective views.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method, comprising:
displaying a computer-simulated design environment on a user viewable screen of an automation control system, the design environment configured to create and modify programming objects for graphical features displayed on a human machine interface, the programming objects being executable to monitor and/or control operation of an automation controller via a run-time environment;
providing a tool within the computer-simulated design environment, wherein the tool is configured to modify the computer-simulated design environment; and
generating a visual representation of a first conduit segment extending between a first anchor point and a second anchor point on the user viewable screen, wherein the first anchor point and second anchor point are generated based on sequential activations of the tool;
wherein a Bezier curve is created in the visual representation of the first conduit segment when the tool is activated at a first location on the user viewable screen along the visual representation of the first conduit segment and repositioned to a second location on the user viewable screen not along the visual representation of the first conduit segment;
wherein the visual representation comprises a property of at least one of the programming objects, and
wherein the visual representation is presented via the human machine interface to a user during monitoring and/or control of the automation controller in the run-time environment.

2. The method of claim 1, comprising creating a third anchor point in the computer-simulated design environment using the tool, wherein the third anchor point is not collinear with the first and second anchor points, and generating a visual representation of a second conduit segment extending between the second anchor point and the third anchor point on the user viewable screen.

3. The method of claim 2, comprising creating a visual representation of a joint between the visual representation of the first conduit segment and the visual representation of the second conduit segment.

4. The method of claim 3, wherein the visual representation of the joint comprises a graphic of an elbow joint, a corner joint, or a T-joint.

5. The method of claim 1, wherein the visual representation of the first conduit segment is a pipe representation or a cable representation.

6. The method of claim 1, comprising generating the first anchor point and the second anchor point in the computer-simulated design environment with the tool based on input from a pointing device.

7. The method of claim 6, wherein the first anchor point is generated at a location of a portion of the tool on the user viewable screen at the time of a first activation of the pointing device and the second anchor point is generated at a location on the user viewable screen of the portion of the tool at the time of a second activation of the pointing device immediately subsequent to the time of the first activation.

8. The method of claim 1, comprising generating a fill in the visual representation of the first conduit segment based on a virtual light source created in the computer-simulated design environment.

9. The method of claim 1, wherein the visual representation of the first conduit segment is linear.

10. An interface system, comprising:
a non-transitory, computer-readable medium comprising programming code stored thereon; and
the programming code stored on the non-transitory, computer-readable medium comprising instructions for:
displaying a computer-simulated design environment on a user viewable screen of the interface system, the design environment configured to create and modify programming objects for graphical features displayed on a human machine interface, the programming objects being executable to monitor and/or control operation of an automation controller via a run-time environment;
providing a tool within the computer-simulated design environment, wherein the tool is configured to modify the computer-simulated design environment; and
generating a visual representation of a first conduit segment extending between a first anchor point and a second anchor point on the user viewable screen, wherein the first anchor point and second anchor point are generated based on sequential activations of the tool;
wherein a Bezier curve is created in the visual representation of the first conduit segment when the tool is activated at a first location on the user viewable screen along the visual representation of the first conduit segment and repositioned to a second location on the user viewable screen not along the visual representation of the first conduit segment;
wherein the visual representation comprises a property of at least one of the programming objects, and
wherein the visual representation is presented via the human machine interface to a user during monitoring and/or control of the automation controller in the run-time environment.

11. The interface system of claim 10, wherein the programming code stored on the tangible, computer-readable medium comprises instructions for generating a fill in the visual representation of the first conduit segment based on a virtual light source created in the computer-simulated design environment.

12. The interface system of claim 10, wherein the programming code stored on the tangible, computer-readable medium comprises instructions for creating a visual representation of a joint between the visual representation of the first conduit segment and a visual representation of a second conduit segment, wherein the visual representation of the second conduit segment extends between the second anchor point and a third anchor point generated based on activation of the tool, wherein the third anchor point is not collinear with the first and second anchor points.

13. The interface system of claim 12, wherein the visual representation of the joint comprises a graphic of an elbow joint, a 90 degree corner joint, or a T-joint.

14. The interface system of claim 10, wherein the visual representation of the first conduit segment is a pipe representation or a cable representation.

15. An automation controller, comprising:
a non-transitory, computer-readable medium comprising programming code stored thereon;
a processor configured to implement the programming code, for display on a user-viewable screen, a design environment and a run-time environment based on the design environment,
wherein the design environment is configured to create and modify programming objects for graphical features displayed on a human machine interface, the programming objects being executable to monitor and/or control operation of an automation controller via a run-time environment; and wherein the design environment further comprises a tool configured to modify graphical features within design environment by generating a visual representation of a first conduit segment extending between a first anchor point and a second anchor point on the user viewable screen, wherein the first anchor point and second anchor point are generated based on sequential activations of the tool; and wherein a Bezier curve is created in the visual representation of the first conduit segment when the tool is activated at a first location on the user viewable screen along the visual representation of the first conduit segment and repositioned to a second location on the user viewable screen not along the visual representation of the first conduit segment;

wherein the visual representation comprises a property of at least one of the programming objects, and wherein the visual representation is presented via the human machine interface to a user during monitoring and/or control of the automation controller in the run-time environment.

16. The automation controller of claim 15, wherein the visual representation of the first conduit segment is a pipe representation or cable representation.

17. The automation controller of claim 15, wherein the visual representation of the joint is graphic representing an elbow joint, a corner joint, or a T-joint.

* * * * *